United States Patent [19]

Barnes et al.

[11] Patent Number: 4,478,884
[45] Date of Patent: Oct. 23, 1984

[54] PRODUCTION OF VITREOUS ENAMELLED SUBSTRATES

[75] Inventors: Allan F. Barnes, London, England; Clarence L. Wallace, San Marcos, Calif.

[73] Assignee: Cookson Group plc, London, England

[21] Appl. No.: 446,695

[22] Filed: Dec. 3, 1982

[30] Foreign Application Priority Data

Dec. 4, 1981 [GB] United Kingdom ................ 8136652

[51] Int. Cl.³ .............................................. B05D 5/12
[52] U.S. Cl. ...................................... 427/97; 427/239; 29/852
[58] Field of Search ...................... 427/97, 239; 29/852

[56] References Cited

U.S. PATENT DOCUMENTS 3,739,469 6/1973 Dougherty ............................ 29/852
3,873,756 3/1975 Gall ...................................... 427/97

OTHER PUBLICATIONS

Onyshkevych, et al, *Manufacturing Steps in the Production of Porcelain Enamel PC Boards.*

Primary Examiner—John E. Kittle
Assistant Examiner—James J. Seidleck
Attorney, Agent, or Firm—Watson, Cole, Grindle & Watson

[57] ABSTRACT

A method of applying an enamel coating (14 and 15) to an apertured (11) metal base (10) is characterized by plugging the or each aperture with an electrically insulating material (12), applying a coating (14, 15) of a vitreous material to one or both surfaces (13 and 16) of the base and then removing a core (18) of the vitreous material and the insulating material from the or each apertures to leave it lined with insulating material during subsequent firing of the vitreous material.

By this means, thinning of vitreous material around the aperture is avoided, reducing the likelihood of electrical connection between the metal base and an electrical conductor extending through the aperture. The invention has particular application to the manufacture of electrical printed circuits.

12 Claims, 6 Drawing Figures

U.S. Patent  Oct. 23, 1984  4,478,884 ic # PRODUCTION OF VITREOUS ENAMELLED SUBSTRATES

FIELD OF THE INVENTION

This invention relates to a method of, and apparatus for, the production of vitreous enamelled (procelain enamelled) substrates.

BACKGROUND OF THE INVENTION

Substrates used for the production of thick film and integrated circuits may be produced by the application of a layer of vitreous or porcelain enamel to a base, which is generally metallic and usually steel. The vitreous enamel is usually applied to the base by dipping, spraying or electrophoretic deposition (note: other methods are sometimes employed) and is then fired to cause fusion or sintering of the enamel into a coating adherent to the base. The enamel when applied to the base may have all or some of its constituents premixed, presintered or premelted, or a mixture of the enamel constituent may be applied.

These existing methods suffer from disadvantages. It is difficult to achieve flatness when enamel powder is applied to the base and this lack of flatness is reproduced to a lesser or greater extent when the coating has been fired. This lack of flatness causes problems when circuitry is applied to the surface, typically but not exclusively by the process known as silk screen printing wherein the screen material is usually synthetic fibre or metal. Also, the techniques at present in use frequently allow air bubbles to exist in the final fired coating, leading to a reduction in the electrical resistance value. Also, as progressively thicker coatings are applied, the problems of unevenness of coating and air bubbles increase so that the maximum thickness of coating which can be applied in practice may be less than desirable for certain applications.

There is also a tendency for iron ions from the substrate to migrate into the enamel surface causing electrical problems, and such migration is usually precluded or minimised by applying a barrier layer of some sort, usually nickel, to the surface of the steel.

Holes through metal bases which are to be vitreous enamelled present a problem in that severe thinning of the enamel occurs at the sharp edges which remain when holes are produced, as by punching or drilling. This results in low electrical resistance or, in extreme cases, short circuiting between the metal base and conductor wires passing through such holes. To minimise such problems it has been proposed that the edges of the holes be rounded or coined so that the tendency for the enamel to thin or draw away is minimised. This approach is not always satisfactory and in any case increases the cost of the preparation of the substrates.

SUMMARY OF THE INVENTION

It is an object of the present invention to bring about economies in production of apertured substrates by avoiding the need for the above-mentioned step of rounding or coining.

According to the present invention there is provided a method of applying an enamel coating to an apertured metal base characterised by the steps of plugging the or each aperture with an electrically-insulating material, applying a coating of a vitreous material to one or both surfaces of the base and then removing a core of the vitreous material and the insulating material from around the longitudinal axis of the or each aperture to leave the aperture lined with the insulating material.

The invention also provides an apparatus for performing the above method, and substrates made by the method and apparatus of the invention. These substrates may then be subjected to a firing step so as to yield a vitreous enamelled substrate.

The invention has major application to the manufacture of thick film and integrated circuits carried in the enamel, in which application there is frequently need for apertures, known as vias, in the underlying metal base.

Preferably, the vitreous material is applied to the metal base in the form of a length of a cast tape. In the manufacture of thick film and integrated circuits, the tape may be printed after application to the metal base. Otherwise, it has been proposed by the present applicants to print a circuit pattern on the tape prior to application of the tape to the metal base.

In tape preparation, a mixture of ground enamel materials plus binding agents plus liquid is slowly stirred under vacuum so that entrapped air bubbles are eliminated. The mixture is then transferred gently to avoid entrapment of air to a band casting machine in which it is cast to uniform thickness on a travelling band, e.g., of polyester. A tape may be cast on the band to any desired thickness and this process produces cast tape with a very flat and level surface. After drying to remove the liquid, the tape now consisting of enamel constituents and binder is easy to handle and has a rubber-like consistency. A circuit pattern may be printed on the tape, which is then laminated, e.g., by means of a pressure roller, to the steel or other base with or without the use of a surface coating to act as an adhesive to bind the tape to the base. The tape may be laminated to one or both surfaces of the base. After lamination the product is fired to fuse or sinter the enamel layer and to cause it to bond to the base.

Instead of applying a single layer of tape of enamel/binder it is possible to apply two or more layers. The individual layers may be of the same or different compositions. Thus the individual layers may have different electrical or mechanical properties or the layer next to a steel base may have good adhesion properties or may prevent or reduce the tendency for iron to migrate into the layer from the steel. In this case if the composition of the layer adjacent to the steel has less satisfactory electrical properties a composition may be chosen for the outer layer which will adhere to the first layer and has superior electrical properties or a superior surface onto which the circuitry could be printed.

The improved method of dealing with holes through a vitreous enamelled (procelain enamelled) substrate may be performed as follows. After holes are made through a metal base, a mixture of insulating material plus binder plus liquid is applied to the metal by means of, for example, a squeegee so that all holes are filled with the mixture but the metal surface is left nominally free from such material. The material in the mixture may be an enamel the same as, or different from, the enamel to be applied to the surface. For example, it may be a mixture of the enamel and another suitable material such as alumina, zirconia, beryllia, etc., or any other material having the necessary properties. Prior to filling the holes in the described manner it is preferable to remove burrs from them and to reduce the sharpness of the edges. After the holes have been filled in this way, a band cast enamel/binder tape or tapes are applied to one or both surfaces, although the enamel can be applied in a form other than a tape, if desired. Using for reference the same positioned co-ordinates as were employed to make the holes in the metal base (and this will generally be accomplished by use of computer-controlled equipment in a manner known per se), a punch or drill of a diameter smaller than used to make the holes in the steel is passed through each of the filled holes so as to leave a cylinder of material around the hole to act as an insulating sleeve. The material chosen to fill the holes and finally act as an insulating sleeve is usually more refractory than the enamel and so does not melt or fuse when the enamel is fired and is so chosen that the enamel will bond to it. The material inserted in the holes may itself bond to the steel at the holes or may contain an additive or additives to assist such bonding.

Instead of casting the tape of enamel/binder separately and then laminating it to the base, it is also possible to cast such tape directly onto the base.

BRIEF DESCRIPTION OF THE DRAWING

One way of performing the method of the invention will now be described by reference to the accompanying drawing, in which.

DETAILED DESCRIPTION

Figure 1:
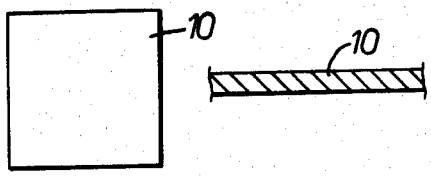
FIGS. 1 to 6 each show a plan and a fragmentary section through an aperture of a metal base plate of an enamelled substrate, the Figures together showing successive stages in the preparation of the substrate.
Figure 2:
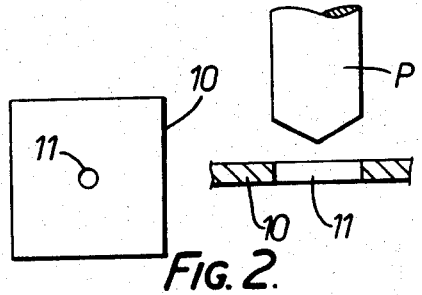

Referring to FIGS. 1 and 2, a plain steel plate 10 is carefully cleaned and prepared for enamelling, then punched with a punch P in a computer-controlled machine tool to provide a via hole 11 and any burrs or rough edges on the via are removed.

Figure 3:
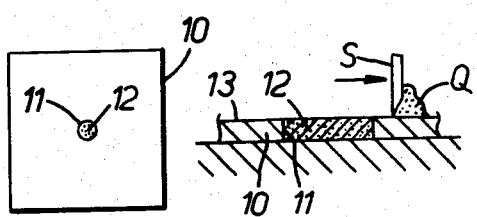

In FIG. 3, the via hole 11 is filled with a refractory/enamel slurry mixture 12 by application to the upper face 13 of the plate of a quantity Q of the slurry which is scraped across the face 13 by a squeegee S.

Figure 4:
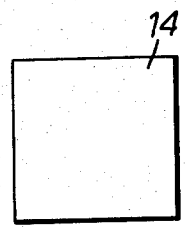
Figure 4:
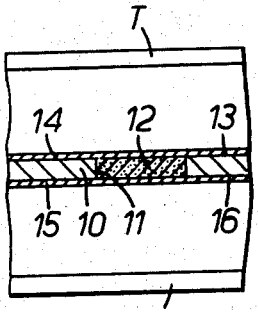

In FIG. 4, discrete lengths 14 and 15 of a cast tape of a vitreous material and binder are applied by a tool T to the upper face 13 and lower face 16 of the metal base 10. These tapes occlude the via hole 11, as is apparent from the plan view in FIG. 4.

Figure 5:
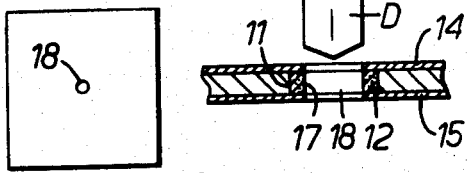
Figure 6:
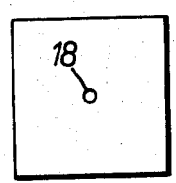

Next, as in FIG. 5, and using the positional data which determined the position of the via hole, a computer-controlled punch or drill D penetrates the tape 14, the plug 12 of refractory/enamel mixture and the other tape 15, the drill being on the longitudinal axis A of the via hole 11 and of a diameter small enough to leave a sleeve 17 within the via hole 11, the drilled or punched via hole 18 being concentric with the via hole 11. The assembly is then fired, as in FIG. 6, to transform the vitreous material to enamelled layers 14 and 15 on the metal base 10, and cause the refractory/enamel material of the sleeve 17 to bond to the enamel and the metal thereby ensuring that electroconductive components inserted subsequently into the via hole 18 do not contact the metal 10.

Examples of the method of the invention will now be given.

Example 1

Holes of diameter 3 mm were punched in a base plate of copper clad Invar (trade mark). These holes were filled, as described above, with a slurry mixture of zirconia powder and from 20% to 40% by weight of the powder of a composition being itself a mixture of an enamel powder and a liquid binder system, the binder system being in accordance with the following composition:

20-30% methylethylketone solvent, 20-35% toluene solvent, 5-15% methylmethacrylate binder, 0.5-5% dibutyl phthalate plasticiser, 0-2% lecithin.

Lecithin, when included, is a dispersant.

To both sides of the plugged metal base were applied lengths of tape of thickness 0.25 mm cast from a slurry of a ground enamel material in a binder system as used in the hole-filling material above. The enamel was EL 2010, from Ferro Corporation of Columbus, Ohio, U.S.A. Holes were punched through the tape-plug-tape layers, concentric with the original holes and of diameter in a range of from 1.5 to 2.25 mm diameter.

After firing at a temperature at which the zirconia did not fuse, it was found that there had been substantially no thinning of insulating material around the holes in the metal base.

Example 2

The procedure of Example 1 was followed except that the metal base was of steel, and a different ground enamel, EL 2020, appropriate to steel, was used. Again, no substantial thinning of insulating material around the holes was observed.

Example 3

The procedure of Example 1 was followed, except that the enamel material used was in accordance with Example 30 of U.S. Pat. No. 4,256,796. Again, no substantial thinning of insulating material around the holes was observed.

Example 4

The procedure of Example 1 was followed except that, instead of one layer of vitreous tape, three layers each 0.075 mm thick were laminated onto each face of the metal base prior to the step of punching the via. Again, no substantial thinning was detected.

We claim:

1. A method of applying an enamel coating to an apertured metal base characterized by the steps of:
   (i) plugging each aperture in the metal base with an electrically-insulating material;
   (ii) applying a coating of a vitreous material to at least one surface of the metal base to form an assembly;
   (iii) removing a core of the vitreous material and the insulating material from around the longitudinal axis of each aperture to leave each aperture lined with the insulating material, and
   (iv) firing the assembly obtained in step (iii).

2. A method according to claim 1 wherein said insulating material is in the form of a slurry.

3. A method of applying an enamel coating according to claim 1 wherein said insulating material is a mixture of a ground enamel material, a ground refractory material and a binder.

4. A method according to claim 1 wherein the vitreous material applied to each surface of the base is in the form of a cast tape.

5. A method according to claim 4 including the further step of printing the cast tape with a circuit pattern.

6. A method according to claim 5 wherein the step of printing is carried out prior to application of the tape to the base.

7. A method according to claim 1 characterised in that the insulating material is selected to have a fusing temperature higher than that of the vitreous material.

8. A method according to claim 7 including the step of firing the enamelled substrate at a temperature which results in fusing of the vitreous material but not the insulating material.

9. A method according to claim 1 wherein said metal base consists of a steel plate.

10. A method of providing a porcelain enamelled steel substrate which has at least one electrically-insulated aperture therein, said method comprising the sequential steps of
   (a) providing a steel substrate which includes at least one aperture that extends from one side thereof to the other and defines a longitudinal axis extending through said steel substrate,
   (b) plugging each aperture in said steel substrate with an electrically-insulated material,
   (c) applying a coating of a vitreous material to at least one surface of said steel substrate so as to cover said plugged apertures therein and provide a composite product,
   (d) forming a hole in the composite product obtained in step (c) along each said longitudinal axis, the diameter of said hole being less than the diameter of the aperture defining the longitudinal axis, and
   (e) firing said composite product obtained in step (d) to transform each coating of vitreous material into a porcelain enamelled layer and to thus provide an apertured porcelain enamelled steel substrate, each aperture having an electrically-insulating lining therein.

11. The method according to claim 10 wherein said electrically-insulating material has a higher fusing temperature than said vitreous material.

12. A method as defined in claim 10 wherein each aperture in said steel substrate is plugged with an electrically-insulating material in step (b) by spreading a slurry containing an electrically-insulating material over one side of steel substrate so as to fill the apertures therein.

* * * * *